United States Patent
Sudijono et al.

(10) Patent No.: US 6,429,117 B1
(45) Date of Patent: Aug. 6, 2002

(54) METHOD TO CREATE COPPER TRAPS BY MODIFYING TREATMENT ON THE DIELECTRICS SURFACE

(75) Inventors: John Sudijono; Yakub Aliyu; Mei Sheng Zhou; Simon Chooi; Subhash Gupta; Sudipto Ranendra Roy; Paul Kwok Keung Ho; Yi Xu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 33 days.

(21) Appl. No.: 09/619,018

(22) Filed: Jul. 19, 2000

(51) Int. Cl.[7] .............. H01L 21/4763; H01L 21/44; H01L 21/31; H01L 21/469
(52) U.S. Cl. .......... 438/627; 438/643; 438/653; 438/687; 438/765; 438/958
(58) Field of Search ............... 438/633, 597, 438/627, 643, 677, 687, 765, 653, 958

(56) References Cited

U.S. PATENT DOCUMENTS

| | | | |
|---|---|---|---|
| 4,965,656 A | * 10/1990 | Koubuchi et al. | 257/742 |
| 5,431,774 A | 7/1995 | Douglas | 216/57 |
| 5,451,542 A | 9/1995 | Ashby | 437/173 |
| 5,821,168 A | 10/1998 | Jain | 438/692 |
| 5,831,283 A | 11/1998 | Batey et al. | 257/66 |
| 5,953,628 A | 9/1999 | Kawaguchi | 438/635 |
| 5,990,008 A | 11/1999 | Koyama et al. | 438/687 |
| 6,001,415 A | * 12/1999 | Nogami et al. | 427/97 |
| 6,294,836 B1 | * 9/2001 | Paranjpe et al. | 257/758 |
| 6,309,982 B1 | * 10/2001 | Chooi et al. | 438/758 |

\* cited by examiner

*Primary Examiner*—Richard Elms
*Assistant Examiner*—Adam Pyonin
(74) *Attorney, Agent, or Firm*—George O. Saile; Stephen B. Ackerman; Stephen G. Stanton

(57) ABSTRACT

A method of preventing metal penetration and diffusion from metal structures formed over a semiconductor structure, comprising the following steps. A semiconductor structure including a patterned dielectric layer is provided. The patterned dielectric layer includes an opening and an upper surface. The dielectric layer surface is then passivated to form a passivation layer. A metal plug is formed within the dielectric layer opening. The passivation layer prevents penetration and diffusion of metal out from the metal plug into the semiconductor structure and the patterned dielectric layer.

34 Claims, 2 Drawing Sheets

METHOD TO CREATE COPPER TRAPS BY MODIFYING TREATMENT ON THE DIELECTRICS SURFACE

FIELD OF THE INVENTION

The present invention relates generally to fabrication of semiconductor devices used in integrated circuits, and specifically to a method of creating copper traps during fabrication of semiconductor devices.

BACKGROUND OF THE INVENTION

Without treatment, the dielectric surface is susceptible to copper (Cu) penetration and diffusion. Thus there is potential damage to the device since Cu has a long diffusion length, especially with the number of thermal cycles present in the normal process flow.

U.S. Pat. No. 5,451,542 to Ashby describes a method for passivating compound semiconductor surfaces by photolytically disturbing molecular sulfur vapor with ultraviolet radiation to form reactive sulfur which then reacts with, and passivates, the compound semiconductor surfaces.

U.S. Pat. No. 5,953,628 to Kawaguchi describes a method for forming copper wiring for a semiconductor device within $SiO_2$ insulating layers. An $SiO_2$ insulating layer and an intermediate $SiO_2$ insulating layer are stacked successively. An opening is formed within the intermediate $SiO_2$ insulating layer and a copper wiring is formed within the opening. The copper wiring is covered with an anti-oxidation layer that is not a transition metal as in conventional semiconductor devices, but is copper sulfide ($Cu_xS$ where $0<x\leq2$).

U.S. Pat. No. 5,990,008 to Koyama et al. describes a method of forming high aspect copper structures that permits a heightened degree of copper burying. For example, a fine connecting hole may be formed in a layer insulating film on a silicon substrate. A CVD-TiN barrier film is formed on the etched insulating film as an adhesive film, and a copper film having thickness of 1 $\mu$m is then formed over the TiN adhesive film. The copper film has a high level of purity with an oxygen concentration of 0.5 ppm or lower, and a sulfur concentration of 0.06 ppm or lower. A heat treatment is applied and a copper fine contact hole is formed without voids.

U.S. Pat. No. 5,431,774 to Douglas describes a method of dry etching metals, such as copper, using—acids in an energetic environment such as a plasma, laser, or afterglow reactor, or by using ligands forming volatiles at low temperatures within a pulsed energetic environment.

U.S. Pat. No. 5,821,168 to Jain describes a process for forming a semiconductor device in which an insulating layer is nitrided and then covered by a thin adhesion layer before depositing a composite copper layer. The process does not require a separate diffusion barrier as a portion of the insulating layer (SiO) is converted to form a diffusion barrier film (SiON) by performing a plasma nitriding step.

U.S. Pat. No. 5,831,283 to Batey et al. describes a layer for passivating copper, aluminum, or other refractory metal films using ammonia-free silicon nitride.

SUMMARY OF THE INVENTION

Accordingly, it is an object of the present invention to prevent copper penetration and diffusion into the dielectric surface.

Another object of the present invention is to create a copper barrier by strong adhesion with ligand sites binding copper.

A further object of the present invention is to create a polymer 'virtual' copper barrier that is highly resistant to thermal cycles due to the stability of the polymers.

Other objects will appear hereinafter.

It has now been discovered that the above and other objects of the present invention may be accomplished in the following manner. Specifically, a semiconductor structure including a patterned dielectric layer is provided. The patterned dielectric layer includes an opening and an upper surface. The dielectric layer surface is then passivated to form a passivation layer. A metal plug is formed within the dielectric layer opening. The passivation layer prevents penetration and diffusion of metal out from the metal plug into the semiconductor structure and the patterned dielectric layer.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Process Common to Each of the Embodiments

Figure 1:
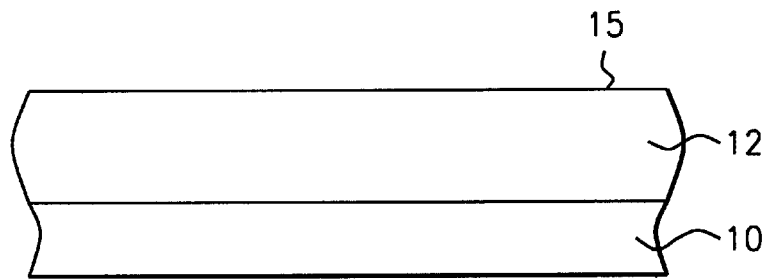
FIGS. 1 and 4 schematically illustrate in cross-sectional representation structures common to the four embodiments of the present invention.

Accordingly as shown in FIG. 1, starting semiconductor structure 10 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer.

The upper surface of semiconductor structure 10 can be comprised of a dielectric layer, e.g. ILD layer, an ILD layer with conductive plugs exposed, an intermetal layer (IMD), or an IMD layer with metal plugs or lines exposed (not shown).

Dielectric layer 12 is formed over semiconductor structure 10. Dielectric layer 12 has a thickness from about 7000 to 16,000 Å, and more preferably from about 4000 to 8000 Å. Dielectric layer 12 includes upper, outer exposed surface 15.

Dielectric layer 12 may be a CVD low-k dielectric material, a spin-on -dielectric (SOD) material, silicon dioxide ($SiO_2$ or "oxide"), porous oxide, fluorine-doped oxide, carbon-doped oxide, or boron-phosphosilica glass (PSG).

Dielectric layer 12 is preferably porous oxide for the first embodiment, and carbon doped oxide (for example Black Diamond™ available from Applied Materials) for the second, third and fourth embodiments.

Figure 2:
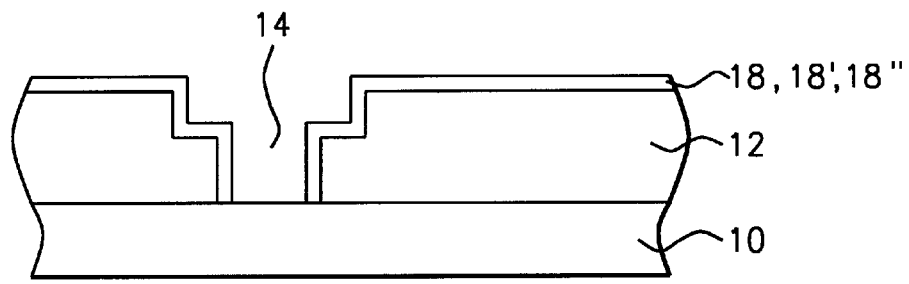
FIG. 2 schematically illustrates in cross-sectional representation a structure common to the first three embodiments of the present invention.
Figure 3:
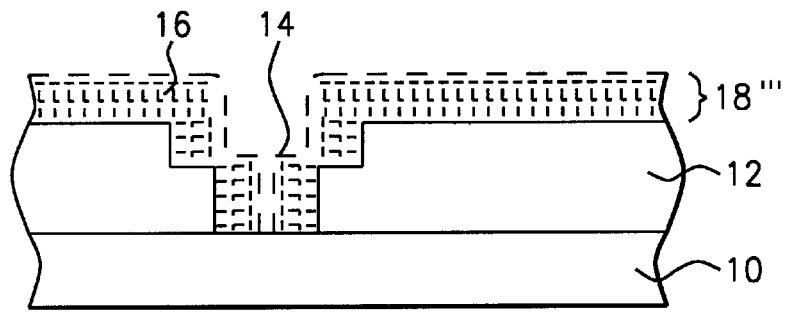
FIG. 3 schematically illustrates in cross-sectional representation a structure of the fourth embodiment of the present invention.

As shown in FIG. 2, dielectric layer 12 is patterned and etched to form opening 14 that extends to, and contacts the exposed metal plugs or lines on the upper surface of semiconductor structure 10. Dielectric layer 12 may be patterned by an overlying layer of photoresist (not shown), for example. Upper surface 15 of dielectric layer 12 extends into opening 14.

Opening 14 may be a dual damascene opening as shown in FIG. 2, or another shape such as a single damascene opening. Opening 14 has a minimum opening from about 1000 to 50,000 Å wide, more preferably from about 1000 to 10,000 Å wide, and most preferably from about 1000 to 5000 Å wide.

Formation of Generic Passivation Layer 18

Exposed surface 15 of etched dielectric layer 12 is then passivated to form passivation layer 18 over dielectric layer 12. Passivation layer 18 may be formed by one of four methods as detailed below in the respective four embodiments of the invention. Passivation layer 18 is preferably from about 5 to 1000 Å thick, and more preferably from about 5 to 100 Å thick.

Figure 4:
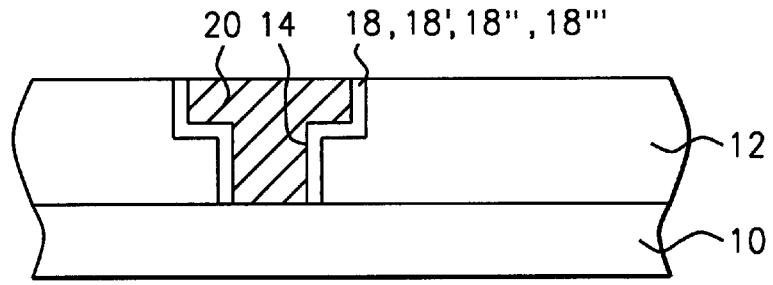

As shown in FIG. 4, regardless of which method is used to form passivation layer 18, 18', 18", 18'", passivation layer 18, 18', 18", 18'" becomes a virtual barrier to metal plug 20. Metal plug 20 may be comprised of copper (Cu), aluminum copper alloy (Al(Cu)), gold (Au), silver (Ag) or aluminum (Al), and is preferably copper (Cu).

First Embodiment—Pure Sulfur Treatment

In the first embodiment, passivation layer 18 is formed by treating exposed surface 15 of etched dielectric layer 12 with pure sulfur in a thermal process having the parameters:

flow rate of sulfur gas: from about 10 to 1000 cm³/minute, and more preferably from about 100 to 300 cm³/minute;

temperature: from about 25 to 500° C., and more preferably from about 25 to 200° C.; and time: from about 10 to 100 seconds, and more preferably from about 10 to 30 seconds.

Pure sulfur passivation layer 18 is formed in a separate standard passivation chemical vapor deposition (CVD) chamber with plasma enhanced RF source or remote plasma application. The pure sulfur gas may be obtained from Aldrich Chemicals or Merck.

Pure sulfur passivation layer 18 is comprised of $SO_3$, $SO_2$ bonds and is from about 5 to 100 Å thick, and more preferably from about 5 to 25 Å thick.

Second Embodiment—Sulfur-Containing Compound Treatment

In the second embodiment, passivation layer 18' is formed by treating exposed surface 15 of etched dielectric layer 12 with a sulfur-containing gaseous compound at the following parameters:

concentration of sulfur-containing compound: from about 0.5 to 100 at. %, and more preferably from about 10 to 50 at. % temperature: from about 25 to 250° C., and more preferably from about 50 to 100° C.; and time: from about 10 to 300 seconds, and more preferably from about 10 to 60 seconds.

The structure is moved to a separate, remote plasma chamber with remote RF source or downstream plasma to form pure sulfur passivation layer 18'. This plasma chamber may be a standard plasma asher available in manufacturing line.

The sulfur-containing compound may comprise a mixture of $NH_4$ and $H_2S$, and is most preferably $H_2S$.

Third Embodiment—$(NH_4)_2S$ Solution Treatment

In the third embodiment, passivation layer 18" is formed by treating exposed surface 15 of etched dielectric layer 12 with a $(NH_4)_2S$ (aq) solution at the following parameters:

concentration of $(NH_4)_2S$ (aqueous) (standard aqueous solution) from about 0.01 to 1 moles/liter, and more preferably 0.05 to 0.5 moles/liters;

temperature: from about 25 to 150° C., and more preferably from about 25 to 50° C.; and time: from about 10 to 200 seconds, and more preferably from about 30 to 60 seconds.

The structure is moved to a separate chamber for formation of $(NH_4)_2S$ treated passivation layer 18". The separate chamber may be a simple and standard chemical bath with a heater block for temperature control.

$(NH_4)_2S$ solution treatment passivation layer 18" is comprised of sulfur terminated bonds and is from about 5 to 50 Å, and more preferably from about 5 to 20 Å.

Fourth Embodiment—Surface Modification Through Self-Assembly Technique

In the fourth embodiment, the more preferred embodiment because the surface termination with ligand sites 16 has a broader application, passivation layer 18'" is formed by modifying exposed surface 15 of etched dielectric layer 12 through a self-assembly technique. "Self-assembly" implies the spontaneous formation of passivation layer 18'" without any additional processing or deposition.

Figure 5A:
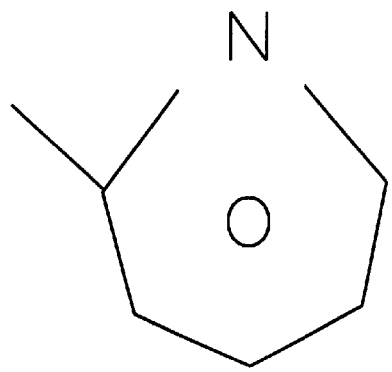
FIG. 5A is the chemical structure of pyridine.
Figure 5B:
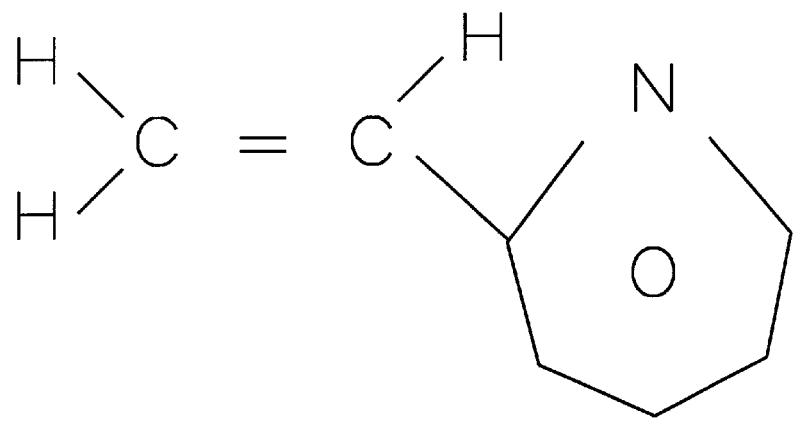
FIG. 5B is the chemical structure of (2-pyridyl)-ethene.
Figure 5C:
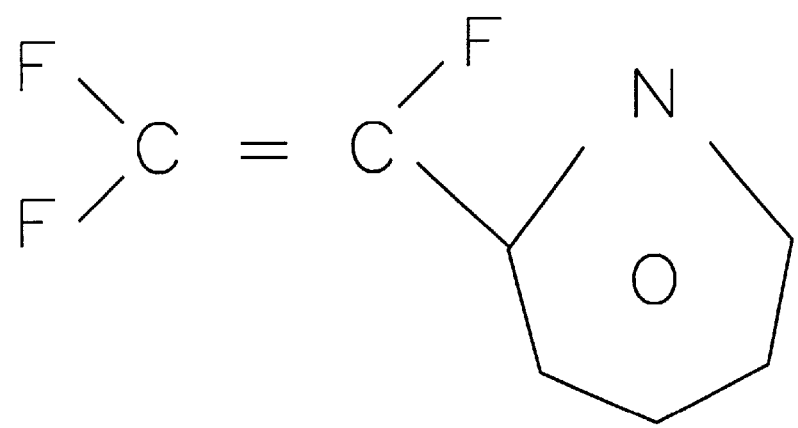
FIG. 5C is the chemical structure of (2-pyridyl)-triofluoroethane.

Ligand sites 16 are formed on the exposed surface of etched dielectric layer 12 and within opening 14 at the following parameters:

ligand: pyridine (see FIG. 5A);

Criteria for Selecting Ligands additives: hydrogen and fluorine;

polymers: (2-pyridyl)-ethene (see FIG. 5B) and (2-pyridyl)-triofluoroethane (see FIG. 5C);

temperature: from about 25 to 500° C., and more preferably from about 200 to 400° C.; and time: from about 10 to 500 seconds, and more preferably from about 30 to 60 seconds.

Ligand sites 16 in conjunction with the additives with polymers form passivation layer 18'" that has a strong bonding affinity with copper (Cu) to create a virtual barrier. For example, the following structures illustrate polymers with additives and ligand sites 16:

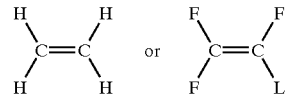

Where "L" is the ligand (i.e., e.g. pyridine as shown in FIG. 5A) attached to ligand site 16. Also see FIGS. 5B (2pyridyl)-ethene) and 5C (2-pyridyl)-triofluoroethane).

These compounds, for example, serve to form passivation layer 18'" as they represent the self-assembly of the polymers on the hydrophilic surface to which the molecules (ligands) bond. These compounds may be formed by: a CVD method with direct plasma, i.e. plasma chemical vapor deposition (PECVD); remote plasma, i.e. downstream CVD; or by a reactor with a high-pressure environment to form the self-assembly of the molecules.

Process Common to Each of the Embodiments

As shown in FIG. 4, regardless of which embodiment is selected to form passivation layer 18, 18', 18", 18'", a layer of metal is deposited over passivation layer 18, 18', 18", 18'" and planarized to remove the excess of the metal layer and the portion of passivation layer 18, 18', 18", 18'" from the upper horizontal surface of etched dielectric layer 12 to form planarized metal plug 20 within opening 14.

Metal plug 20 may be formed from copper, aluminum, gold, aluminum copper alloy (Al(Cu)), or silver (Ag), and is preferably copper. For purposes of illustration, metal plug 20 will be considered to be formed of copper hereafter.

Passivation layer 18, 18', 18", 18'" serves as a virtual barrier layer against the migration of copper from copper plug 20 into etched dielectric layer 12 and semiconductor structure 10 by, in effect, creating copper traps.

Advantages of the Present Invention

The present invention:
strongly passivates the exposes etch dielectric layer 12 with sulfur or sulfur containing compounds in the first, second and third embodiments to form passivation layer 18, 18', 18";

in the fourth embodiment, allows for strong adhesion with ligand sites 16 binding copper so as to create a virtual Cu barrier (passivation layer 18'"); and in the fourth embodiment, the resulting structure is highly resistant to thermal cycles due to stable polymer.

While particular embodiments of the present invention have been illustrated and described, it is not intended to limit the invention, except as defined by the following claims.

We claim:

1. A method of preventing metal penetration and diffusion from metal structures formed over a semiconductor structure, comprising the steps of:

providing a semiconductor structure including a patterned dielectric layer having an opening thereon; said patterned dielectric layer having an upper surface;

passivating said dielectric layer surface to form a passivation layer; and forming a metal plug within said dielectric layer opening; whereby said passivation layer prevents penetration and diffusion of metal out from said metal plug into said semiconductor structure and said patterned dielectric layer.

2. The method of claim 1, wherein said dielectric layer is comprised of a material selected from the group consisting of: silicon oxide, a CVD low-k dielectric material, a spin-on-dielectric (SOD) material, silicon oxide, porous oxide, fluorine-doped oxide, carbon-doped oxide, and boron-phosphosilica glass (PSG).

3. The method of claim 1, wherein said opening has a width from about 1000 to 10,000 Å.

4. The method of claim 1, wherein said dielectric layer is comprised of carbon doped oxide, and said opening has a width from about 1000 to 5000 Å.

5. The method of claim 1, wherein said dielectric layer surface passivation step is selected from the group consisting of: a thermal pure sulfur treatment passivation; a sulfur-containing compound treatment passivation; a $(NH_4)_2S$ solution treatment passivation; and a self-assembly technique surface modification passivation.

6. The method of claim 1, wherein said passivation layer is from about 10 to 1000 Å thick.

7. The method of claim 1, wherein said passivation layer is from about 10 to 100 Å thick.

8. A method of preventing metal penetration and diffusion from metal structures formed over a semiconductor structure, comprising the steps of:

providing a semiconductor structure including a patterned dielectric layer having an opening thereon; said patterned dielectric layer having an upper surface;

thermally treating said patterned dielectric layer upper surface with sulfur to passivate said dielectric layer surface and form a passivation layer; and forming a metal plug within said dielectric layer opening; whereby said passivation layer prevents penetration and diffusion of metal out from said metal plug into said semiconductor structure and said patterned dielectric layer.

9. The method of claim 8, wherein said dielectric layer is comprised of a material selected from the group consisting of: silicon oxide, carbon doped oxide, CVD low-k material, SOD low-k material, and porous oxide.

10. The method of claim 8, wherein said opening has a width from about 1000 to 10,000 Å.

11. The method of claim 8, wherein said dielectric layer is comprised of porous oxide, and said opening has a width from about 1000 to 5000 Å.

12. The method of claim 8, wherein said passivation layer is from about 10 to 1000 Å thick.

13. The method of claim 8, wherein said thermal sulfur passivation step is conducted at the following parameters:

flow rate of sulfur gas: from about 10 to 1000 $cm^3$/minute, and more preferably from about 100 to 300 $cm^3$/minute;

temperature: from about 25 to 500° C., and more preferably from about 25 to 200° C.; and time: from about 10 to 100 seconds, and more preferably from about 10 to 30 seconds.

14. A method of preventing metal penetration and diffusion from metal structures formed over a semiconductor structure, comprising the steps of:

providing a semiconductor structure including a patterned dielectric layer having an opening thereon; said patterned dielectric layer having an upper surface;

treating said patterned dielectric layer upper surface with a sulfur-containing compound to passivate said dielectric layer surface and form a passivation layer; and forming a metal plug within said dielectric layer opening; whereby said passivation layer prevents penetration and diffusion of metal out from said metal plug into said semiconductor structure and said patterned dielectric layer.

15. The method of claim 14, wherein said sulfur-containing compound a mixture of $NH_4$ and $H_2S$.

16. The method of claim 14, wherein said dielectric layer is comprised of a material selected from the group comprised of: silicon oxide, a CVD low-k dielectric material, a spin-on-dielectric (SOD) material, silicon oxide, porous oxide, fluorine-doped oxide, carbon-doped oxide, and boron-phosphosilica glass (PSG).

17. The method of claim 14, wherein said opening has a width from about 1000 to 1000 Å.

18. The method of claim 14, wherein said dielectric layer is comprised of carbon doped oxide, and said opening has a width from about 1000 to 5000 Å.

19. The method of claim 14, wherein said passivation layer is from about 10 to 1000 Å thick.

20. The method of claim 14, wherein said sulfur-containing treatment passivation step is conducted at the following parameters:

concentration of sulfur-containing compound: from about 0.5 to 100 at. %, and more preferably from about 10 to 50 at. % temperature: from about 25 to 250° C., and more preferably from about 50 to 100° C.; and time: from about 10 to 300 seconds, and more preferably from about 10 to 60 seconds.

21. The method of claim 14, wherein said sulfur-containing compound is $H_2S$.

22. A method of preventing metal penetration and diffusion from metal structures formed over a semiconductor structure, comprising the steps of:
provviding a semiconductor structure including a patterned dielectric layer having an opening thereon; said patterned dielectric layer having an upper surface;
treating said patterned dielectric layer upper surface with an $(NH_4)_2S$ solution to passivate said dielectric layer surface and form a passivation layer; and
forming a metal plug within said dielectric layer opening; whereby said passivation layer prevents penetration and diffusion of metal out from said metal plug into said semiconductor structure and said patterned dielectric layer.

23. The method of claim 22, wherein said dielectric layer is comprised of a material selected from the group comprised of: silicon oxide, a CVD low-k dielectric material, a spin-on-dielectric (SOD) material, silicon oxide, porous oxide, fluorine-doped oxide, carbon-doped oxide, and boron-phosphosilica glass (PSG).

24. The method of claim 22, wherein said opening has a width from about 1000 to 1000 Å.

25. The method of claim 22, wherein said dielectric layer is comprised of carbon doped oxide, and said opening has a width from about 1000 to 5000 Å.

26. The method of claim 22, wherein said passivation layer is from about 10 to 1000 Å thick.

27. The method of claim 22, wherein said $(NH_4)_2S$ solution treatment passivation step is conducted at the following parameters:
from about 0.01 to 1 moles/liter, and more preferably 0.05 to 0.5 moles/liters of $(NH_4)_2S$ (aqueous) (standard aqueous solution);
temperature: from about 25 to 150° C., and more preferably from about 25 to 50° C.; and
time: from about 10 to 200 seconds, and more preferably from about 30 to 60 seconds.

28. A method of preventing metal penetration and diffusion from metal structures formed over a semiconductor structure, comprising the steps of:
providing a semiconductor structure including a patterned dielectric layer having an opening thereon; said patterned dielectric layer having an upper surface;
modifying said upper surface through a self-assembly technique to passivate said dielectric layer surface and form a passivation layer; and
forming a metal plug within said dielectric layer opening; whereby said passivation layer prevents penetration and diffusion of metal out from said metal plug into said semiconductor structure and said patterned dielectric layer.

29. The method of claim 28, wherein said dielectric layer is comprised of a material selected from the group comprised of: silicon oxide, a CVD low-k dielectric material, a spin-on-dielectric (SOD) material, silicon oxide, porous oxide, fluorine-doped oxide, carbon-doped oxide, and boron-phosphosilica glass (PSG).

30. The method of claim 28, wherein said opening has a width from about 1000 to 10,000 Å.

31. The method of claim 28, wherein said dielectric layer is comprised of carbon doped oxide, and said opening has a width from about 1000 to 5000 Å.

32. The method of claim 28, wherein said passivation layer is from about 10 to 1000 Å thick.

33. The method of claim 28, wherein said self-assembly technique passivation step includes the steps of:
forming ligand sites, including polymers, on said dielectric layer upper surface; said ligand sites including pyridine ligands;
wherein said self-assembly technique passivation step is further conducted at the following parameters:
additives: hydrogen and fluorine;
polymers:(2-pyridyl)-ethene and (2-pyridyl)-triofluoroethane;
temperature: from about 25 to 500° C.; and
time: from about 10 to 500 seconds.

34. The method of claim 28, wherein said self-assembly technique passivation step includes the steps of:
forming ligand sites, including polymers, on said dielectric layer upper surface; said ligand sites including pyridine ligands;
wherein said self-assembly technique passivation step is further conducted at the following parameters:
additives: hydrogen and fluorine;
polymers:(2-pyridyl)-ethene and (2-pyridyl)-triofluoroethane;
temperature: from about 200 to 400° C.; and
time: from about 30 to 60 seconds.

* * * * *